US006929695B2

(12) United States Patent
Koinuma et al.

(10) Patent No.: US 6,929,695 B2
(45) Date of Patent: Aug. 16, 2005

(54) METHOD FOR PREPARING SINGLE CRYSTAL OXIDE THIN FILM

(75) Inventors: Hideomi Koinuma, Tokyo (JP); Masashi Kawasaki, Sendai (JP); Yuji Matsumoto, Yokohama (JP)

(73) Assignee: Japan Science and Technology Agency, Kawaguchi (JP)

( * ) Notice: Subject to any disclaimer, the term of this patent is extended or adjusted under 35 U.S.C. 154(b) by 0 days.

(21) Appl. No.: 10/363,392
(22) PCT Filed: Aug. 31, 2001
(86) PCT No.: PCT/JP01/07582
§ 371 (c)(1), (2), (4) Date: Jun. 16, 2003
(87) PCT Pub. No.: WO02/18678
PCT Pub. Date: Mar. 7, 2002

(65) Prior Publication Data
US 2004/0029737 A1 Feb. 12, 2004

(30) Foreign Application Priority Data
Sep. 1, 2000 (JP) ........................................ 2000-266028

(51) Int. Cl.[7] .......................... C30B 25/12; C30B 25/14
(52) U.S. Cl. .............................. 117/89; 117/84; 117/85; 117/92
(58) Field of Search ................................ 117/84, 85, 89, 117/92

(56) References Cited

U.S. PATENT DOCUMENTS
5,885,939 A    3/1999    Matsunaga et al. ......... 505/474

FOREIGN PATENT DOCUMENTS
| JP | 2-175613 | 7/1990 |
| JP | 7-101796 | 4/1995 |

OTHER PUBLICATIONS

M. Kawasaki et al., *Tri–Phase Epitaxy For Single Crystalline Superconducting Thin Films*, The Third Symposium on Atomic–Scale Surface and Interface Dynamics, Mar. 1999, (Discussed in p. 1 of the specification.).

B.D. Choi et al., *A New Concept of Epitaxy; Triple Phase Epitaxy* (2p–X–4), The 58th Japan Society of Applied Physics Academic Lecture Drafts, Oct. 1997.

B.D. Choi et al., *Growth of the High Tc Superconducting ReBa$_2$Cu$_3$O$_{7-x}$Films by Triple Phase Epitaxy* (2p–X–6), The 58th Japan Society of Applied Physics Academic Lecture Drafts, Oct. 1997.

B.D. Choi et al., *Optimization of the Conditions to Fabricate Re123 Thin Films by Tri–Phase Epitaxy* (30a–SL–15), Mar. 1998.

(Continued)

*Primary Examiner*—Felisa Hiteshew
(74) *Attorney, Agent, or Firm*—Westerman, Hattori, Daniels & Adrian, LLP

(57) ABSTRACT

The present invention is an tri-phase epitaxy method for preparing a single crystal oxide thin film, comprising the steps of depositing on a substrate an oxide thin film serving as a seed layer and having the same composition as that of an oxide thin film to be formed, depositing on the seed layer a thin film comprising a substance capable of being melted and liquidized by heat from the substrate and dissolving the oxide to be subsequent by deposited onto the seed layer, heating the substrate to form a liquid layer, and depositing an oxide on the seed layer through the liquid layer by use of a vapor-phase epitaxy method to form the single crystal oxide thin film. In this method, the oxygen partial pressure on the liquid layer is set in the range of 1.0 to 760 Torr during the film-forming step.

8 Claims, 7 Drawing Sheets

OTHER PUBLICATIONS

B.D. Choi et al., *Liquid Film Composition Effects on the Property of $Nd_{1+x}Ba_{2-x}Cu_3O_{7-y}$ Thin Films by Tri–Phase Epitaxy*, Fall 1998.

K.S. Yun et al., *Tri–Phase Epitaxy of High–Tc $RBa_2Cu_3O_{7-x}$ Superconducting Thin Films*, Chem—HTSC IV, Nov. 13, 1998.

M. Kawasaki et al., *Tri–Phase Epitaxy as a Novel Concept for Superconducting Films*, MRS 1998 Fall Meeting, Symposium Q, Nov. 30–Dec. 3, 1998.

K.S. Yun et al., *Estimation of $Nd_{1+x}Ba_{2-x}Cu_3O_{7-y}$ Thin Films by Tri–Phase Epitaxy*, Spring 1999.

M. Kawasaki et al., *Triphase Epitaxy of Single Crystalline High Tc Thin Films*, The 1999 International Workshop on Superconductivity Co–sponsored by ISTEC and MRS, Jun. 27–30, 1999.

METHOD FOR PREPARING SINGLE CRYSTAL OXIDE THIN FILM

TECHNICAL FIELD

The present invention relates to a method of preparing a single crystal oxide thin film, particularly a high-temperature superconducting thin film of $ReBa_2Cu_3O_7$ (Re: Y, Nd or Pr) usable for superconductive devices.

BACKGROUND ART

When a conventional physical vapor deposition (PVD) method or a non-thermodynamical equilibrium process, such as a sputtering method or a pulsed laser deposition (PLD) method is used to prepare a multicomponent oxide thin film, undesirable defects or precipitations are inevitably introduced in the inside of the thin film. Such defects or precipitations will present a serious hazard to developments of high-temperature superconducting devices such as superconducting tunnel junction devices or microwave devices.

In order to solve this problem, the inventors proposed a new method of growing an epitaxial thin film under three phases: solid phase (a seed layer), liquid phase (liquid layer on the seed layer) and gas phase (gas serving as deposition seed), or a tri-phase epitaxy (TPE) method, and reported that a $Nd_{1+x}Ba_{2-x}Cu_3O_{7-y}$ thin film could be fabricated substantially in the form of a single crystal through the tri-phase epitaxy method ("Tri-phase epitaxy for single crystalline superconducting thin films" The Third Symposium on Atomic-scale Surface and Interface Dynamics, 4–5 Mar., 1999).

DISCLOSURE OF INVENTION

Perovskite oxides have significant functions such as high-temperature superconductivity, giant magneto-resistance and excellent ferro and ferri electric property. Oxide electronics on functional materials using the perovskite oxides is regarded as an essential technology for the next generation as an alternative to silicon devices.

In particular, the technology of fabricating a superconducting thin film having a high-quality crystallinity equivalent to silicon semiconductors is essential to device applications for Josephson junction elements using a high-temperature superconducting material. However, it has been difficult for the conventional oxide thin-film fabrication methods to provide a desirable single crystal thin film without any crystal defect because of their principle of crystallizing the thin film directly from gas phase, and the crystallization reaction caused under a significantly non-thermodynamical equilibrium condition.

While the aforementioned TPE method as a new epitaxial thin-film growing method reported by the inventors provides a single crystal oxide thin film having a film quality equal to or slightly higher than that in the conventional PLD method, it has not been able to maintain optimal thermodynamical equilibrium at the boundary of the liquid and gas phases, and consequently a desired film quality has not been obtained.

In the TPE method, a seed layer is deposited on a substrate, and an oxide layer including the same components as those of an oxide thin film to be subsequently deposited onto the seed layer, such as Ba—Cu—O, is deposited on the seed layer. The substrate is heated to form a fused liquid layer, such as Ba—Cu—O, in the oxide layer, and a seed is deposited onto the seed layer on the substrate through the fused liquid layer by use of a conventional vapor-phase epitaxy method.

Through various researches on improvements of the TPE method, the inventors found that the difficulty in maintaining optimal thermodynamical equilibrium at the interface between the liquid and gas phases was caused by instability of the liquid phase in the liquid layer due to the film-forming conditions optimized to the conventional pulsed laser deposition method, such a film-forming chamber under vacuum at an oxygen partial pressure of 200 mTorr and a substrate at a temperature of less than 800° C., and the problem was primarily caused by inadequate oxygen partial pressure in the film-forming chamber or on the liquid layer.

Based on this knowledge, the inventors verified that the above problem could be solved by increase the oxygen partial pressure on the liquid layer, and an enhanced film quality could be obtained by adequately coordinating process parameters such as the temperature of the substrate and the composition of the liquid layer correspondingly to the increased oxygen partial pressure. In addition, it was verified that the obtained crystal from this technique could have a large average grain size equivalent to that of a bulk single crystal.

Specifically, according to the present invention, there is provided an tri-phase epitaxy method for preparing a single crystal oxide thin film, comprising the steps of depositing a first oxide layer serving as a seed layer on a substrate, said seed layer having the same composition as that of an oxide thin film to be subsequently deposited onto the seed layer, depositing a second layer on the seed layer, said second layer comprising a substance capable of being melted and liquidized by heat from the substrate and dissolving the oxide to be subsequently deposited onto the seed layer, heating the substrate to melt the second layer to form a liquid layer, and depositing an oxide on the seed layer through the liquid layer by use of a vapor-phase epitaxy method to form the single crystal oxide thin film. In this method, the oxygen partial pressure on the liquid layer is set in the range of 1.0 to 760 Torr during the step of forming the single crystal oxide thin film by use of a vapor-phase epitaxy method.

In the present invention, the oxygen partial pressure around the substrate may be increased by adjusting the oxygen partial pressure in a film-forming chamber at a given even value or generating an oxygen gas flow around the substrate.

Preferably, the substrate is heated up to a temperature causing no vaporization in the liquid layer.

Preferably, the substrate is heated up to a temperature causing no decomposition in the seed layer and the deposited oxide thin film.

The substance of the second layer to be melted and liquefied may have the same composition as that of the deposited oxide thin film. Further, the composition of the substance may have the lowest melting point with respect to the oxygen partial pressure on the liquid layer.

Specifically, the composition of the second layer may be a eutectic composition of Ba—Cu—O, wherein the ratio of Ba to Cu is 3 to 5. In this case, the formed single crystal oxide thin film is a high-temperature superconducting single crystal thin film of $ReBa_2Cu_3O_{7-y}$ (wherein Re is Y, Nd or Pr, and y is in the range of 0 to 1). In this case, the single crystal oxide thin film can have an average crystal-grain size of 20 μm or more.

The outline of the tri-phase epitaxy method will be described below with reference to FIGS. 2a and 2b. FIG. 2a shows a conventional method of growing a bulk single crystal. In FIG. 2a, the temperature of the boundary A/B is higher than that of the boundary C/D. The difference between these temperatures causes supersaturation in the boundary C/D and solidification in Nd 123 ($NdBa_2Cu_3O_7$) phase.

In the bulk single crystal growing method, the crystal growth advances from A in turn to B, C and D, as shown in a phase diagram of FIG. 2a. In the TPE method, the crystal growth advances from A' to D in a given temperature range between $T_2$ (at which a thin film for forming a liquid layer becomes liquid in its entirety) and $T_3$ (at which superconductivity is lost, and 444 phase appears). Both of these methods have a common solidification process between C and D. In this phase diagram, the temperatures $T_1$ and $T_2$ are 650° C. and 880° C., respectively. When the temperature is increased to $T_2$ or more, A $BaCu_2O_x$ thin film is completely melted.

However, thermodynamical equilibrium at the interface between the liquid and gas phases cannot be optimally maintained due to instability of the liquid phase under the conditions optimized to the conventional pulsed laser deposition method, such as under vacuum at an oxygen partial pressure of 200 mTorr. This reason can be assumed as follows. It is known that the boiling or melting point of a substance generally depends on the pressure of surroundings, and the boiling or meeting point are lowered as the pressure is reduced. In addition, when the pressure is reduced, a solid substance can be sublimed directly to gas but not liquefied. Particularly under a quite low pressure such as 200 mTorr, the oxide thin film for forming a liquid layer is undesirably sublimed to gas before it is melted, but never liquefied.

This sublimation phenomenon also makes it difficult to maintain the substance amount of the liquid layer and perform a stable film formation. Thus, if a single crystal thin film is deposited under occurrence of an extrema sublimation phenomenon at an oxygen partial pressure of about 200 mTorr, the film is deposited without the interposition of the liquid layer, or in the same manner as that in the conventional PVD process without any improvement in film quality.

When the oxygen partial pressure on the liquid layer is increased to 1.0 Torr, no sublimation phenomenon occurs, and the liquid layer can exist on the substrate in liquid phase in the temperature range of its boiling and melting points to allow a target oxide thin film to be deposited approximately under thermodynamical equilibrium. The heating temperature of the substrate is set such that the liquid layer is not vaporized. The heating temperature of the substrate is also set such that the deposited oxide thin film is not decomposed. Preferably, the substrate is heated to the upper-limit of the temperature range causing neither vaporization in the liquid layer nor decomposition in the deposited oxide thin film, because the time period for entering in the thermodynamical equilibrium becomes shorter as the temperature is increased, and it is thereby necessary to set the substrate temperature as higher as possible so as to establish the thermodynamical equilibrium at an adequate speed relative to the deposition speed to assure the optimal thermodynamical equilibrium.

The substance of the second thin film to form the liquid layer should have a composition allowing the liquid layer to be maintained when the substrate is heated up to a temperature causing neither thermal decomposition nor no cease of functions in the seed layer and the deposited oxide thin film. Preferably, the substance of the liquid layer is selected to allow its composition to assumptively have the lowest melting point with respect to the oxygen partial pressure on the liquid layer. This substance may include another element free from precipitation into the deposited oxide thin film to provide a lowered melting point of the liquid layer.

(Function)

Most of crystals are precipitated through a certain liquid and then crystallized. The liquid includes one type in which a substance including components to be crystallized is dissolved in a solvent, and another type in which a substance including components to be crystallized is prepared directly in liquid form.

In a process of growing a bulk single crystal (solid body which is not a thin film) of a superconducting oxide, the crystal is grown while maintaining the thermal phase equilibrium between the crystal and a liquid of Ba—Cu—O, which are constituent elements of a high-temperature superconducting material of $ReBa_2Cu_3O_{7-y}$ (Re: Y, Nd or Pr), at a high temperature. The term "phase equilibrium" means that while substance/energy is continually interchanged between two or more of different physical or chemical states, such interchanged substance/energy is balanced without shifting in net substance/energy.

However, substance/energy is continuously exchanged between two phased (liquid and crystal) to creates a reversible mechanism of damaging and growing the crystal. Thus, frangible regions of the crystal structure such as crystal defects will be selectively incorporated in the reversible mechanism or interchanges, and such defective regions will be selectively removed. As a result, a high-quality single crystal having only a thermodynamically significantly stable structure can be obtained without defect.

As long as the conventional vapor-phase thin-film forming method is used to grow a thin film, an irreversible supersaturated state between gas phase (gas including thin-film components) and solid phase (thin film deposited on a substrate) is inevitably involved in the thin film growth, and consequently no crystal can be theoretically obtained with high quality equivalent to the bulk single crystal, because the phase equilibrium reversible allowing the reversible mechanism of damaging and growing the crystal is not achieved between the liquid and solid phases.

In contrast, according to the TPE method of depositing a thin film from gas phase under the co-existence with liquid phase formed on a substrate in advance, deposited oxide is dissolved to liquid phase, and subsequently deposition and dissolving will be repeated to allow the formed crystal to be damaged and grown through the reversible mechanism even in the thin-film forming process. Preferably, the liquid phase or the liquid layer includes the same constituent elements as those in the deposited oxide thin film. The common constituent elements permit any element of the liquid layer to be incorporated in the deposited oxide thin film without problems. However, if a different constituent element is included in the liquid phase, it can be incorporated in the deposited oxide thin film as an impurity. An oxide including common elements with those of the deposited oxide thin film and having a lower melting point is suitable for the liquid layer used in the TPE method. This method can be used to obtain a thin film crystal having an excellent crystallinity equivalent to the bulk single crystal.

BEST MODE FOR CARRYING OUT THE INVENTION

Figure 1:
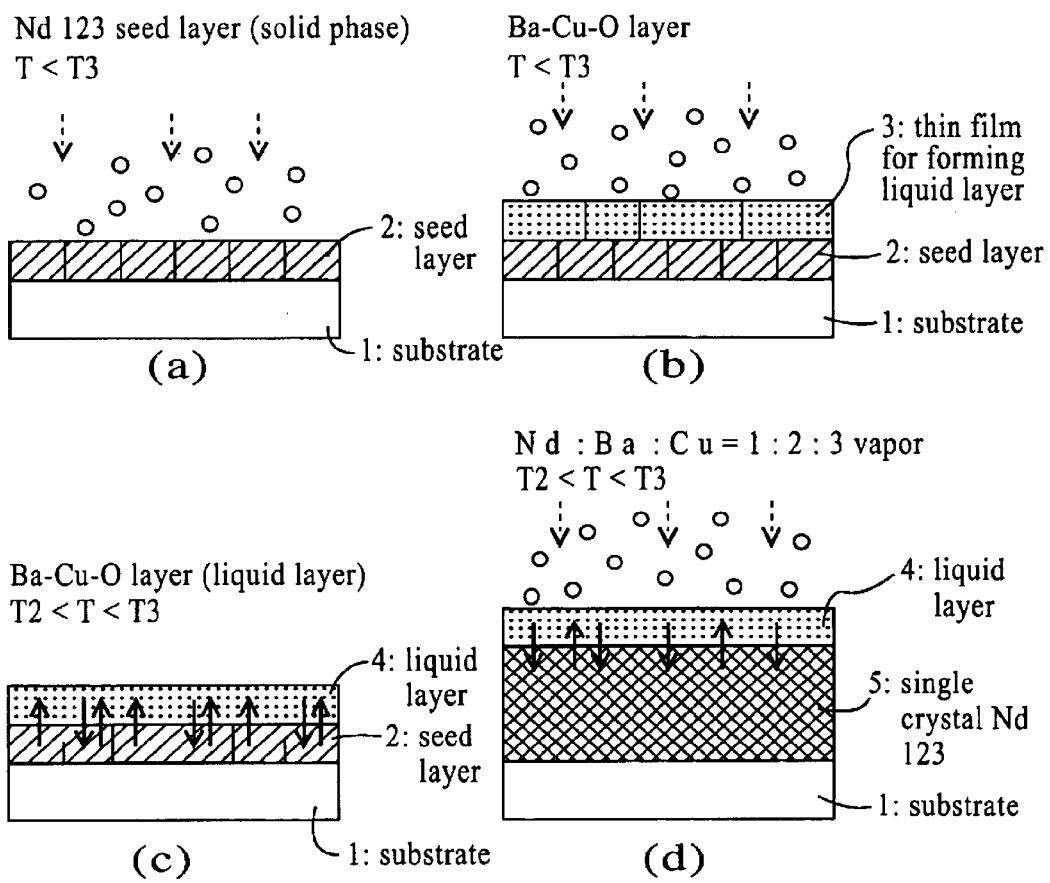
FIGS. 1a–d is a schematic diagram showing a fundamental process of a tri-phase epitaxy method used in a method of the present invention.
Figure 2:
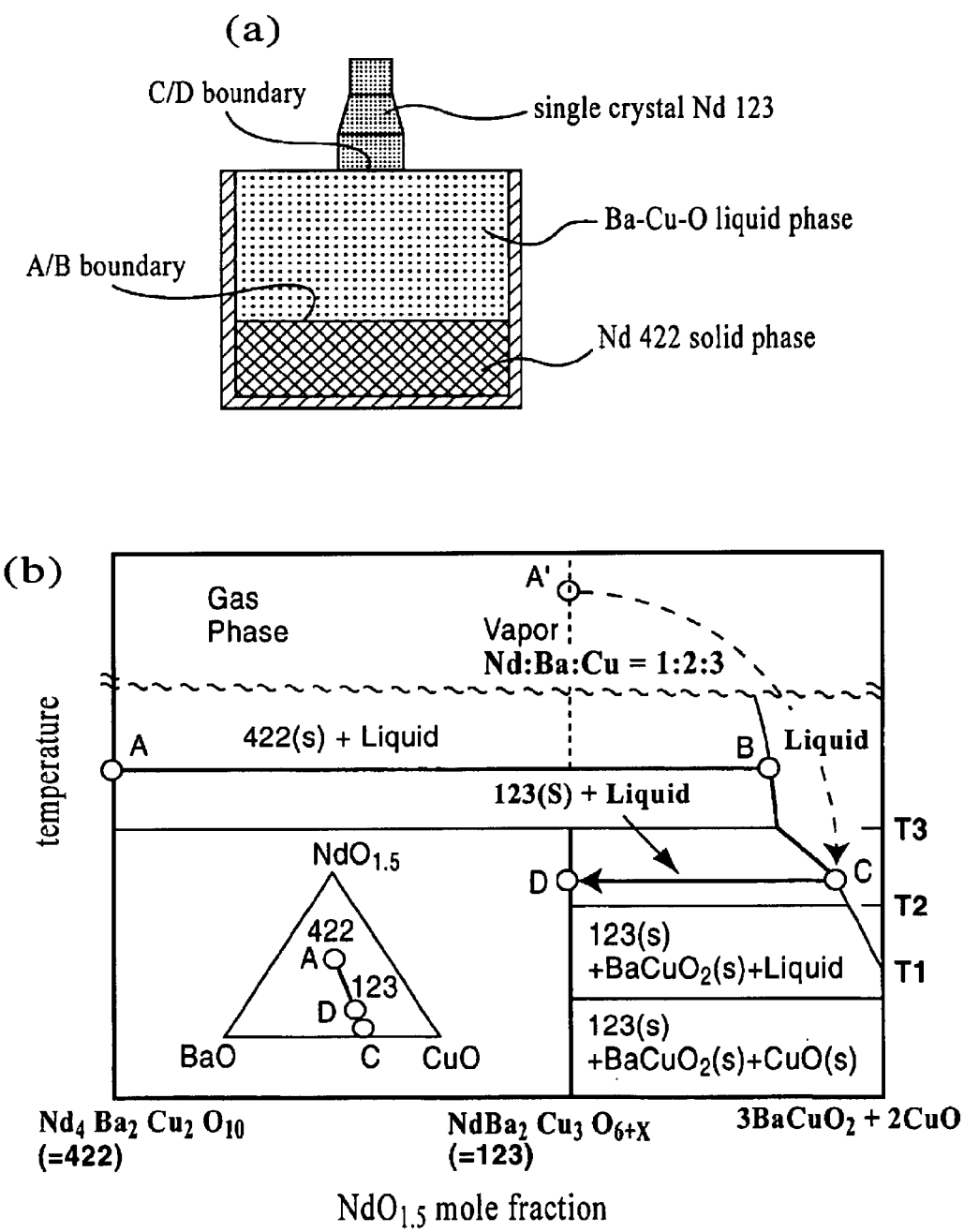
FIG. 2a is a conceptual diagram of a conventional bulk single crystal growing method.
FIG. 2b is a phase diagram of $NdO_{1.5}$—BaO—CuO.

With reference to FIG. 1, a fundamental process of a tri-phase epitaxy method used in a method of the present invention will be described in conjunction with a specific embodiment of preparing $NdBa_2Cu_3O_7$. While a conventional method of depositing a thin film, such as a PLD method, sputtering method, MBE method or MOCVD method may be used commonly for depositing a seed layer, a liquid layer and a film layer to be formed, this embodiment will be described in detail in conjunction with a case of using the PLD method.

Various types of conventional film-forming apparatuses for use in the PLD method can be appropriately used in the method of the present invention. In the film-forming apparatus, a single crystal substrate is held in a chamber capable of being evacuated, and the substrate is heated by a heater located at the back surface of the substrate. A target is placed in the chamber, and the surface of the target is irradiated with and vaporized by a KrF laser outside the chamber. The vapor of the target supplied to the substrate is deposited onto a seed layer of the heated substrate through a liquid layer. The chamber has an oxygen gas inlet to adjust the oxygen partial pressure of the inside of the chamber. In the PLD method, oxygen gas such as $O_2$ or $O_3$ is introduced into the chamber while depositing a thin film to oxidize the deposited thin film.

Such a thin-film forming apparatus is disclosed, for example, in Japanese Patent Laid-Open Publication Nos. 7-267791 and 5-43390. In the former, a substrate is disposed on the upper side of the inner space of a chamber, and a target is disposed opposed to the substrate. An oxygen gas inlet is provided adjacent to the substrate. The thin-film forming apparatus of the latter is operable to flow oxygen gas close to and in parallel to the substrate.

The substrate 1 may be $SrTiO_3$ (100), $LaALO_3$ (001), MgO (001), $NdGaO_3$ (001), $Y_2O_3$, $YBa_2Cu_3O_7$ or YSZ. In the method of the present invention, the distance between the substrate and the target can be reduced from 4 cm (for conventional method) to 2 cm to facilitate optimization of a film-formation speed.

For depositing the seed layer and film layer, 123-type copper oxide polycrystalline is used as a target. An oxide thin film for forming a liquid layer has a composition of Ba—Cu—O. Given that the oxygen partial pressure on the liquid layer is 1 Torr, it is assumable that the composition having the ratio of Ba:Cu=3:5 provides the lowest melting point. Preferably, a mixed-powder sintered body having this ratio is used as the target.

First Step (a): The seed layer 2 composed of Nd 123, which is a first oxide layer having the same composition as the thin film to be subsequently deposited from a vapor of Nd:Ba:Cu=1:2:3, is deposited on the substrate 2.

Second Step (b): In the same chamber in First Step (a), the holder of the target is rotated with a stepping motor by remote control from outside to select a mixed-powder sintered body of Ba:Cu=3:5. Then, a second layer 3 for forming the liquid layer is deposited on the seed layer 2.

Third Step (c): In the same chamber in First Step (a) and Second Step (b), the temperature T of the substrate is increased up to $T_2$ (at which the entire second layer for forming the liquid layer is liquidized) or more. The upper limit of the substrate temperature T is set such that the first layer or the seed layer is not decomposed, and the liquid layer is not vaporized. In this way, the second layer 3 deposited over the seed layer on the substrate 1 in Second Step (b) is heated and melted to form the liquid layer 4. If the substrate temperature T is increased up to $T_2$ or more in Second Step (b), the same substrate temperature T may be maintained in Third Step (c).

Fourth Step (d): A vapor-phase oxide seed for forming the deposited oxide thin film is deposited from a vapor of Nd:Ba:Cu=1:2:3 onto the seed layer 2 through the liquid layer 4 by using the same target as that in First Step (a), to form a single crystal oxide thin film 5.

The oxide partial pressure is set in the range of 1.0 to 760 Torr. If it is less than 1.0, the liquid phase becomes unstable, and the optimum phase equilibrium cannot be achieved. While the oxide partial pressure may be increased up to 760 Torr (atmospheric pressure) without problems, the apparatus involves the following concerns: (1) when the pressure is increased, the substrate temperature T is limited due to the heat conduction from the substrate to ambient gas, and (2) when the pressure is high, the thin film components vaporized (abraded) from the target by the laser is not sufficiently supplied onto the substrate. Thus, it is necessary to use more powerful heater for heating the substrate in terms of the point (1), and to reduce the direction between the substrate and the target in terms of the point (2). In view of the above concerns on the apparatus, it is more preferable to set the oxide partial pressure in the range of 1.0 to 10 Torr.

The upper-limit of the heating temperature of the substrate should be set such that neither decomposition/afunction in the seed and film layers nor vaporization in the liquid layer is caused. The respective temperatures causing the decomposition of the seed or film layers and the vaporization in the liquid layer get higher as the oxide partial pressure is increased. For example, under ambient pressure, YBCO is decomposed at about 1000° C.

While the above embodiment has been described in detail in conjunction with the case of forming a $NdBa_2Cu_3O_7$ thin film by used of the liquid layer of Ba—Cu—O, a liquid layer of Na—B—O may also be used. Na—B—O also has a relatively low melting point of about 900° C. For example, for β-$BaB_2O_4$ (BBO) to be used for generating the second harmonic in Nd-YAG laser, a high-quality BBO thin film can be theoretically obtained by depositing BBO in advance as a seed layer, depositing onto the seed layer a liquid layer of Na—B—O capable of being melted at about 900° C., and additionally supplying a flux having a composition of BBO through the liquid layer.

As above, an oxide containing a specific component and having a low melting point can be used as the liquid layer in the method of the present invention so as to form an oxide thin film including constituent elements in common with the liquid layer in the same way as that in the above embodiment to provide an oxide thin-film crystal equivalent to a bulk single crystal.

EXAMPLE

Example 1

One example will be described in which an $NdBa_2Cu_3O_7$ superconducting thin film was prepared using a conventional pulsed laser deposition apparatus in accordance with the method of the present invention. $SrTiO_3$ (100) was used as a substrate. A sintered polycrystalline having the same composition and structure as a superconducting oxide to be formed was used as a target for depositing a seed layer and a film layer. This sintered polycrystalline was obtained by mixing $RE_2O_3$ powder, $BaF_2$ or $MaCO_3$ powder and CuO powder in conformity with the composition of the film layer, and heating the mixed powder at 1000° C. or more in a conventional electric furnace.

A mixed powder sintered body having the ratio of Ba:Cu= 3:5 was used as a target for depositing an oxide layer for forming a liquid layer. The mixed powder sintered body was obtained by mixing plural kinds of powders, for example $BaF_2$ or $BaCO_3$ powder and CuO powder, to satisfy the ratio of Ba:Cu=3:5, and heating the mixed powder at 1000° C. or more in a conventional electric furnace.

The substrate temperature T was maintained at 800° C. in the entire process. The temperature T is the highest value in the range of a temperature $T_2$ causing liquefaction in the entire liquid-layer forming layer to a temperature $T_3$ causing no decomposition/afunction in the superconducting thin film or a temperature causing no vaporization in the liquid layer.

First Step (Deposition of Seed Layer): The conditions in First Step were set as follows.

Thickness of seed layer: 100 Å (deposition speed 50 Å/min, deposition time: 2 min)

Substrate Temperature: 800° C.

Oxygen partial pressure: 1 Torr

KrF excimer laser: power 120 mV, frequency 4 Hz

Second Step (Deposition of Liquid-Layer Forming Layer): The conditions in Second Step were set as follows. A deposited Ba—Cu—O thin film had the ratio of Ba:Cu= 3:5.

Thickness of liquid-layer forming layer: 600 Å (deposition speed 100 Å/min, deposition time: 6 min)

Substrate Temperature: 800° C.

Oxygen partial pressure: 1 Torr

KrF excimer laser: power 120 mV, frequency 8 Hz

Third Step (Formation of Liquid Layer): After Second Step, the Ba—Cu—O thin film was fully melted, and left for 30 min or more, while maintaining the substrate temperature at 800° C., to arrange the conformity between the seed and liquid layers.

Fourth Step: Then, Nd 123 seed was supplied from above the liquid layer at a rate of 0.028 nm/pulse to form an oxide thin film on the Nd 123 seed layer under the following conditions. A precursor (abrasion fragments) of an Nd film supplied from gas phase was dissolved in the liquid layer, and deposited as a thin film on the Nd 123 seed layer through supersaturation.

Thickness of single crystal oxide thin film: 6000 Å (deposition speed 100 Å/min, deposition time: 60 min)

Substrate Temperature: 800° C.

Oxygen partial pressure: 1 Torr

KrF excimer laser: power 120 mV, frequency 8 Hz

Figure 3:
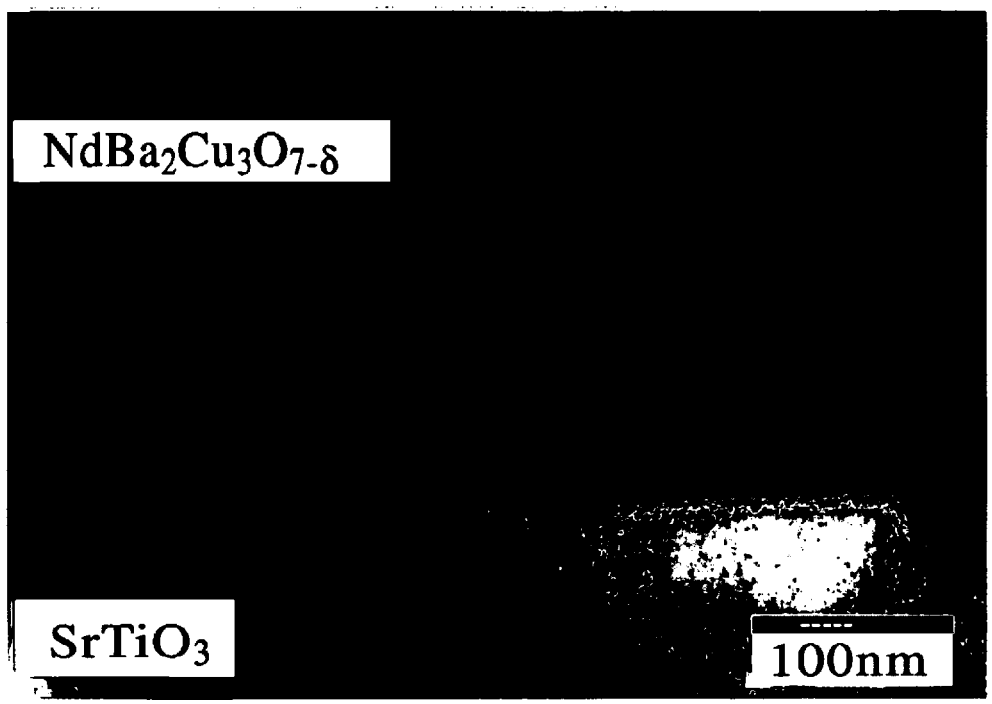
FIG. 3 is a photograph in substitution for drawing showing a cross-sectional TEM image of a thin film obtained through a conventional PLD method.
Figure 4:
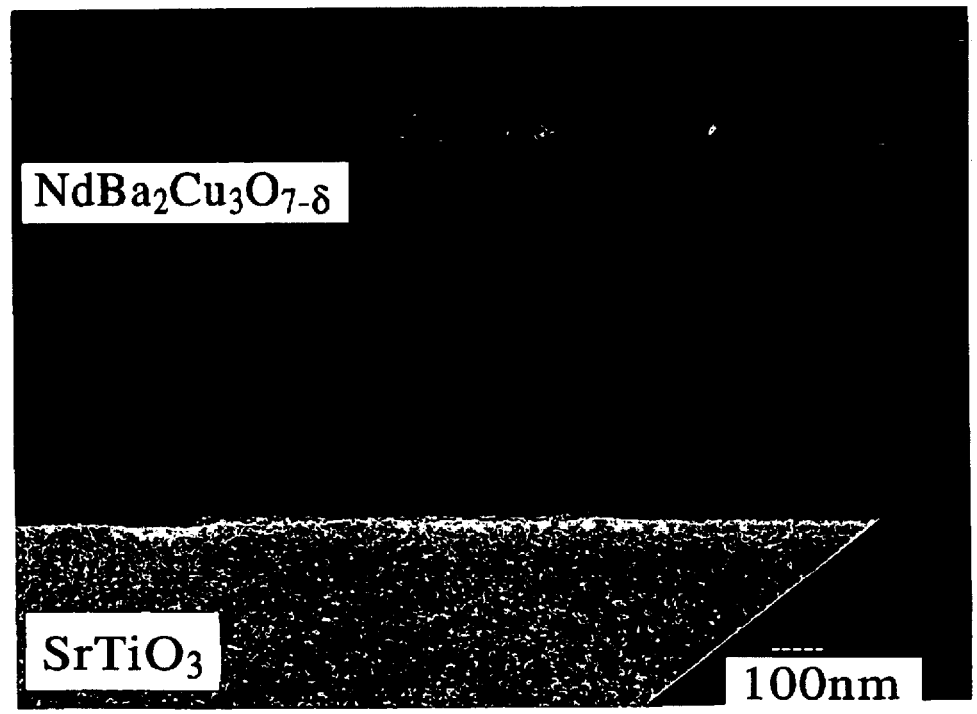
FIG. 4 is a photograph in substitution for drawing showing a cross-sectional TEM image of a thin film obtained in Example 1.

The structural of the prepared thin film was analyzed by a cross-sectional TEM. FIG. 3 is a photograph showing a cross-sectional TEM image of a thin film obtained through a conventional PLD method. FIG. 4 is a photograph showing a cross-sectional TEM image of a thin film obtained in Example 1. In the thin film from the conventional PLD method, defects such as stacking fault extend vertically and horizontally, and these defects are observed all around as lines. By contrast, the thin film obtained in Example 1 is a high-quality single crystal without crystal defect over about ten micron. The prepared $NdBa_2Cu_3O_7$ film has a crystal grain size of 20 μm or more, up to 60 μm.

With respective to the superconductivity of the film, electrical and magnetic properties were checked through a 4-probe method and SQUID, respectively. As a result, Jc (superconducting current density) based on the area of the closed curve in the M-H curve was small. The smaller value of Jc means fewer defects during superconducting, and the value is equivalent to a bulk single crystal.

Figure 5:
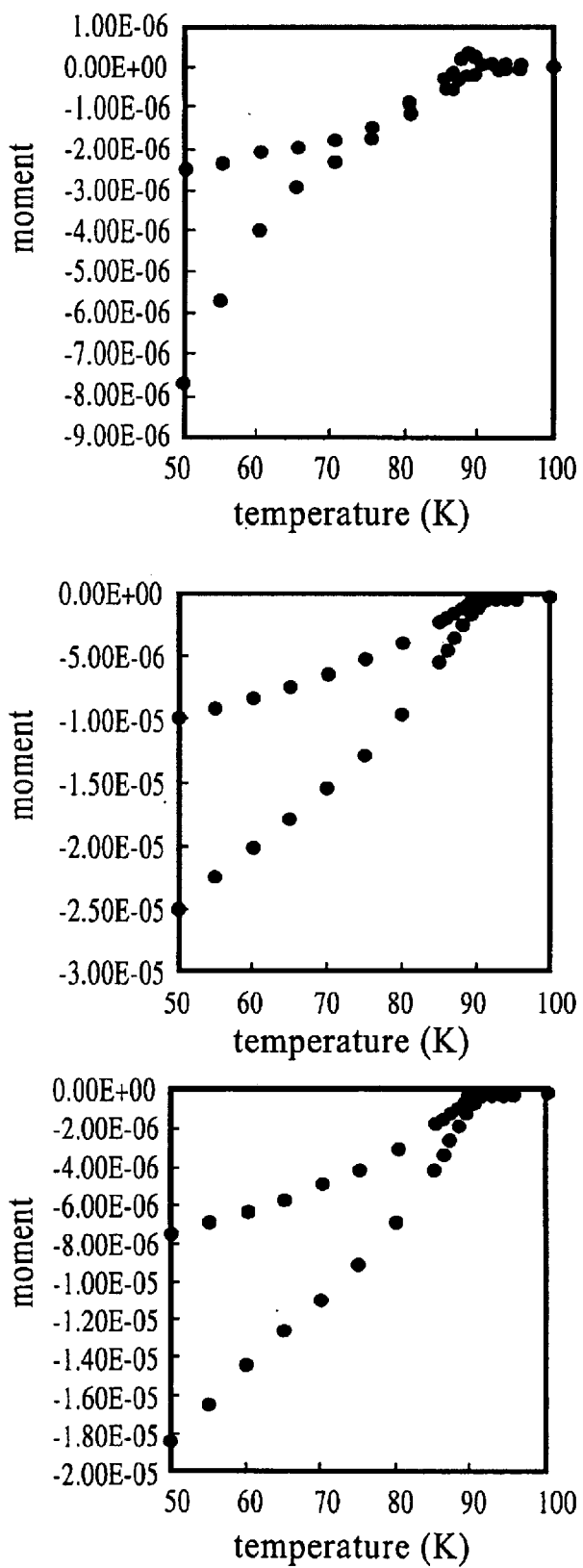
FIG. 5 is a graph showing an M-T curve according to SQUID data of the thin film obtained in Example 1.

As shown in FIG. 5, the superconducting transition temperature in the M-T curve has a certain width. This width means unevenness in oxygen compositions caused by difficulty in introducing oxygen into the crystal through a conventional oxygen treatment due to its excellent crystallinity.

Figure 6:
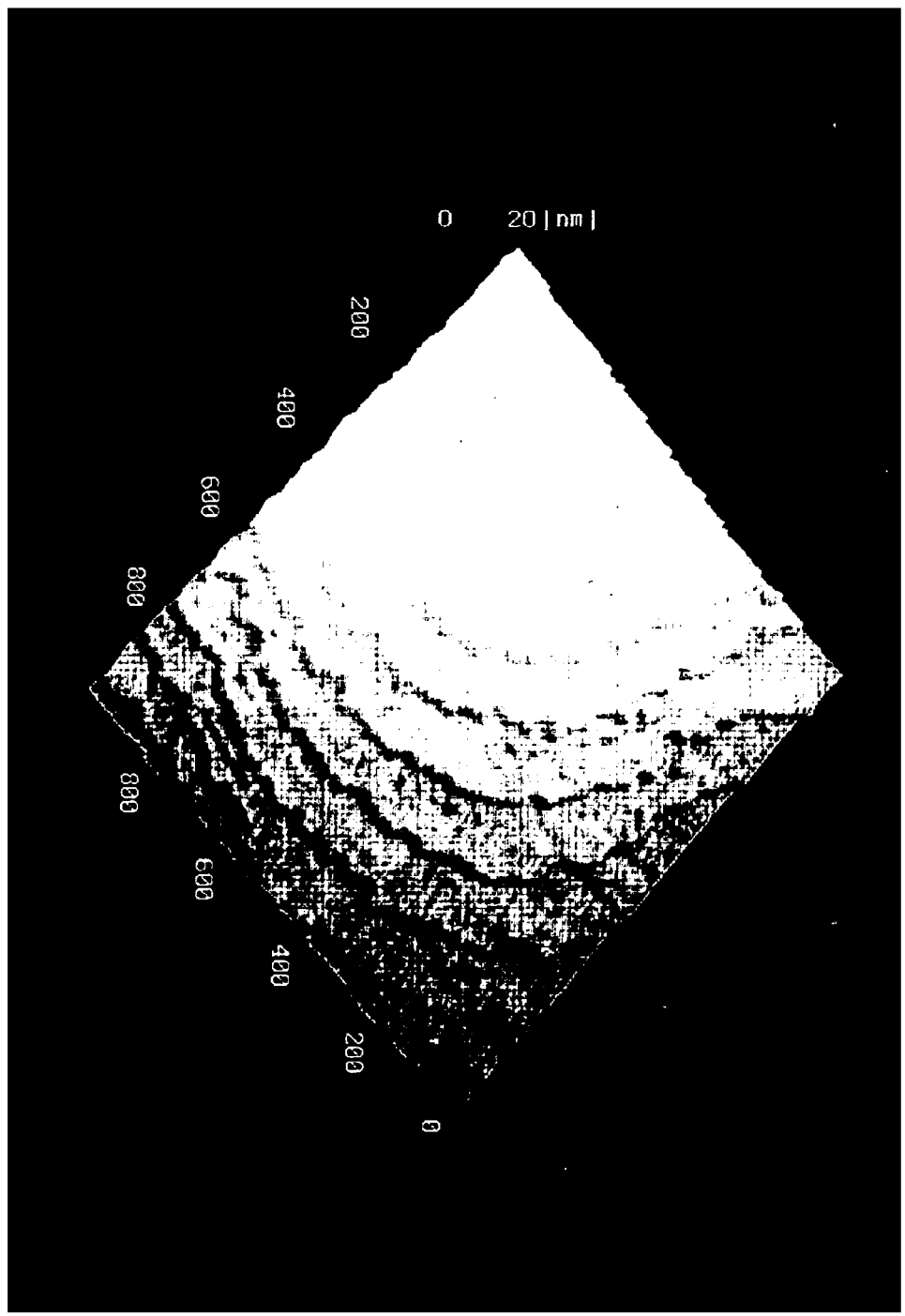
FIG. 6 is a photograph in substitution for drawing showing a step-terrace structure according to an AFM of the thin film obtained in Example 1.

In the observation of surface morphology through AFM, as shown in FIG. 6, a step-terrace structure equivalent to the height of c-axis of unit lattice clearly appeared in a thin film obtained by removing the liquid layer attached to the formed thin film. This film shows an atomically ultra-smooth surface with a step of about 1.1 nm equivalent to unit lattice.

Example 2

An $NdBa_2Cu_3O_7$ film was formed in the same manner as that of Example 1 excepting that MgO (001) was used as a substrate.

Figure 7:
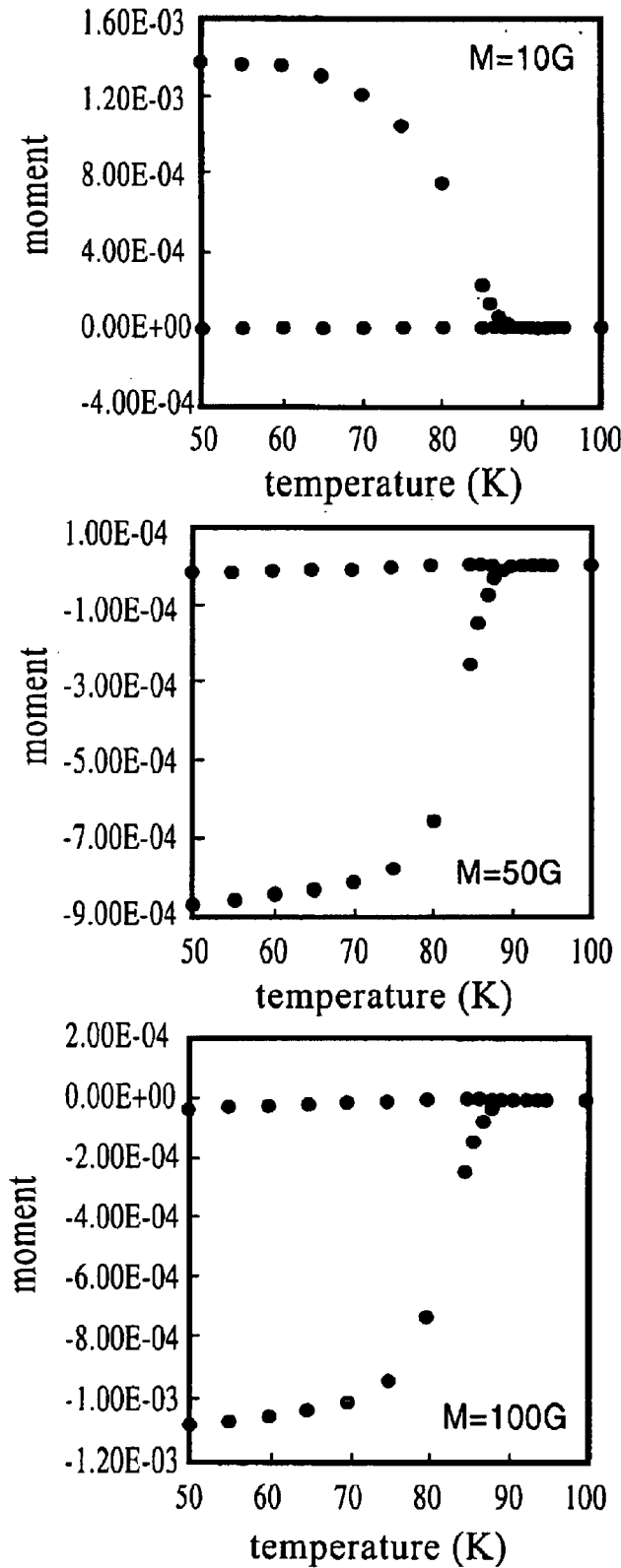
FIG. 7 a graph showing an M-T curve according to SQUID data of a thin film obtained in Example 2.
Figure 8:
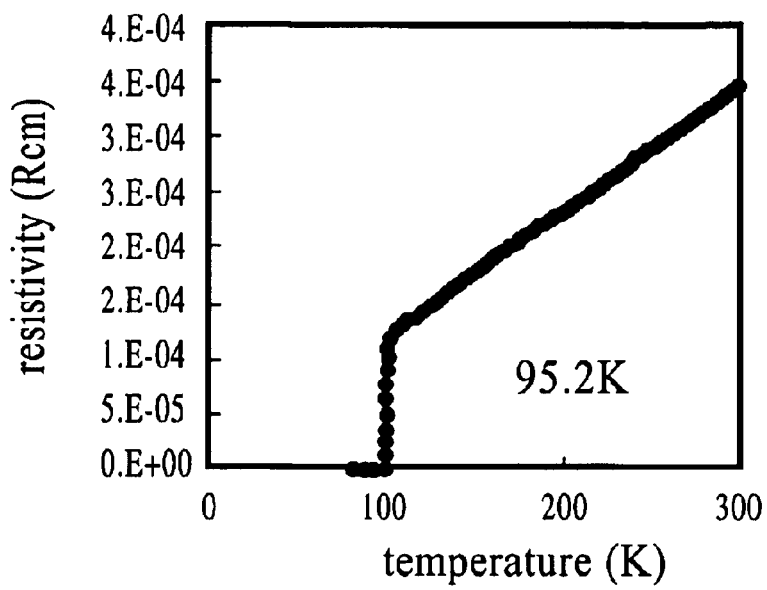
FIG. 8 is a graph showing a temperature dependence of the resistivity of the thin film obtained in Example 2.
Figure 8:
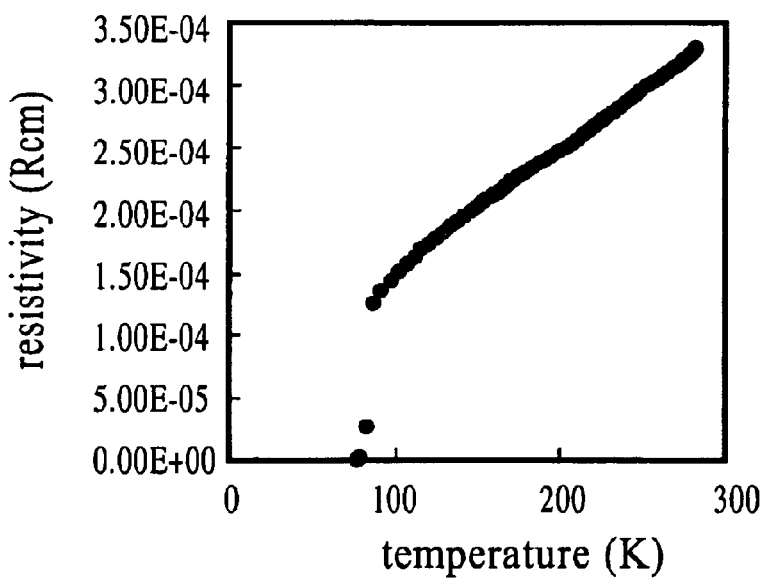

FIG. 7 shows an M-T curve according to SQUID data. FIG. 8 shows a temperature dependence of the resistivity. It is apparent that the thin film obtained in Example 2 is also a superconducting film. While the thin film of Example 2 has a crystallinity slightly inferior to that of Example 1 using $SrTiO_3$ (100), oxygen is readily introduced thereinto because of the lower crystallinity, and the width of the superconducting transition temperature is sharper as shown in FIG. 7.

Comparative Example

An $NdBa_2Cu_3O_7$ film was deposited by selecting the same conditions through First to Third Steps as those of Example 1, and setting the same conditions in Fourth Step 4 as those of Example 1 excepting that the substrate temperature and the oxygen partial pressure were set at 850° C. and 200 mTorr, respectively. As in Example 1, the structure and characteristics of the obtained thin film were analyzed and examined. As a result, the obtained thin film only had a slightly improved crystallinity than the thin film from the conventional PLD method.

INDUSTRIAL APPLICABILITY

The method of the present invention opens the way for practically preparing a high-temperature superconducting thin film of $ReBa_2Cu_3O_7$ (Re: Y, Nd or Pr) usable for superconductive devices. A high-quality superconducting oxide thin film obtained from the present invention can be used to provide significantly enhanced, previously undeveloped, characteristics of high-temperature superconductive devices such as Josephson junctions. In addition, the method of the present invention can be widely applied not only to high-temperature superconductive devices but also to perfect single crystals as materials for other oxides or semiconductors.

What is claimed is:

1. A method of preparing a single crystal oxide thin film, comprising the steps of;

depositing a first oxide layer serving as a seed layer on a substrate, said seed layer having the same composition as that of an oxide thin film to be subsequently deposited onto said seed layer;

depositing a second layer on said seed layer, said second layer comprising a substance capable of being melted and liquidized by heat from said substrate and dissolving the oxide to be subsequently deposited onto the seed layer;

heating said substrate to melt the second layer to form a liquid layer; and depositing an oxide on the seed layer through the liquid layer by use of a vapor-phase epitaxy method to form the single crystal oxide thin film, wherein the oxygen partial pressure on the liquid layer is set in the range of 1.0 to 760 Torr during said step of forming the single crystal oxide thin film by use of a vapor-phase epitaxy method.

2. The method as defined in claim 1, wherein the oxygen partial pressure on the liquid layer is increased by adjusting an oxygen partial pressure in a film-forming chamber at a given even value or generating an oxygen gas flow around said substrate.

3. A method as defined in claim 1 or 2, wherein said substrate is heated up to a temperature causing no vaporization in said liquid layer.

4. A method as defined in claim 1 or 2, wherein said substrate is heated up to a temperature causing no decomposition in said seed layer and said deposited oxide thin film.

5. A method as defined in claim 1, wherein said substance of said second layer has the same composition as that of said deposited oxide thin film.

6. A method as defined in claim 5, wherein said composition of said substance has the lowest melting point with respect to the oxygen partial pressure on said liquid layer.

7. A method as defined in claim 5 or 6, wherein said composition is a eutectic composition of Ba—Cu—O, wherein the ratio of Ba to Cu is 3 to 5, and wherein said formed single crystal oxide thin film is a high-temperature superconducting single crystal thin film of $ReBa_2Cu_3O_{7-y}$, wherein Re is Y, Nd or Pr, and y is in the range of 0 to 1).

8. A method as defined in claim 7, wherein said formed single crystal oxide thin film has an average crystal-grain size of 20 $\mu$m or more.

* * * * *